United States Patent
Meyer-Berg

(10) Patent No.: US 9,159,777 B2
(45) Date of Patent: Oct. 13, 2015

(54) DIE ARRANGEMENTS CONTAINING AN INDUCTOR COIL AND METHODS OF MANUFACTURING A DIE ARRANGEMENT CONTAINING AN INDUCTOR COIL

(75) Inventor: Georg Meyer-Berg, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 589 days.

(21) Appl. No.: 13/087,458

(22) Filed: Apr. 15, 2011

(65) Prior Publication Data
US 2012/0261796 A1    Oct. 18, 2012

(51) Int. Cl.
| | |
|---|---|
| H01L 23/48 | (2006.01) |
| H01L 49/02 | (2006.01) |
| H01L 23/522 | (2006.01) |
| H01L 23/64 | (2006.01) |
| H01L 23/00 | (2006.01) |

(52) U.S. Cl.
CPC ............ *H01L 28/10* (2013.01); *H01L 23/5227* (2013.01); *H01L 23/645* (2013.01); *H01L 24/05* (2013.01); *H01L 24/96* (2013.01); *H01L 2224/0401* (2013.01); *H01L 2224/04042* (2013.01); *H01L 2224/04105* (2013.01); *H01L 2224/12105* (2013.01); *H01L 2924/10253* (2013.01); *H01L 2924/19042* (2013.01); *H01L 2924/19104* (2013.01)

(58) Field of Classification Search
CPC ... H01L 28/10; H01L 23/5227; H01L 23/645; H01L 24/05; H01L 24/96; H01L 2224/0401; H01L 2224/04042; H01L 2224/04105; H01L 2224/12105; H01L 2924/10253; H01L 2924/19042; H01L 2924/19104
USPC .................. 257/531, 428, E29.323, E21.499, 257/E23.01, E21.159
See application file for complete search history.

(56) References Cited

U.S. PATENT DOCUMENTS

| | | | |
|---|---|---|---|
| 6,446,874 | B1 | 9/2002 | Elbaz et al. |
| 6,987,307 | B2 * | 1/2006 | White et al. .................. 257/508 |
| 7,816,792 | B2 | 10/2010 | Tews et al. |
| 7,838,964 | B2 * | 11/2010 | Carobolante et al. ......... 257/531 |
| 8,362,597 | B1 * | 1/2013 | Foster ............................ 257/659 |
| 2005/0285262 | A1 * | 12/2005 | Knapp et al. .................. 257/723 |
| 2007/0001270 | A1 | 1/2007 | Sukegawa et al. |
| 2009/0023400 | A1 * | 1/2009 | Nishio ............................ 455/91 |
| 2009/0140359 | A1 * | 6/2009 | Nakashiba ..................... 257/428 |

FOREIGN PATENT DOCUMENTS

DE    102008046761 A1    4/2009

OTHER PUBLICATIONS

Sharifi, Hasan et al., "Self-Aligned Wafer-Level Integration Technology with High-Density Interconnects and Embedded Passives", IEEE Transaction on Advanced Packaging, vol. 30, No. 1, pp. 11-18, Feb. 2007.

* cited by examiner

*Primary Examiner* — Bilkis Jahan

(57) ABSTRACT

In various embodiments, a die arrangement may be provided. The die arrangement may include a die, at least one bond pad, at least one redistribution trace electrically connecting the die with the at least one bond, and at least one inductor enclosing the at least one bond pad and the at least one redistribution trace.

22 Claims, 9 Drawing Sheets

DIE ARRANGEMENTS CONTAINING AN INDUCTOR COIL AND METHODS OF MANUFACTURING A DIE ARRANGEMENT CONTAINING AN INDUCTOR COIL

TECHNICAL FIELD

Various embodiments relate generally to die arrangements and to methods of manufacturing a die arrangement.

BACKGROUND

Today, fabrication of integrated circuit devices usually includes packaging of the integrated circuits or dies. In the fabrication of die packages such as for example a laminate package or an embedded wafer level ball grid array (eWLB) it may be desirable to accommodate an inductor, e.g. a coil, in a redistribution layer (RDL) of the package.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1:
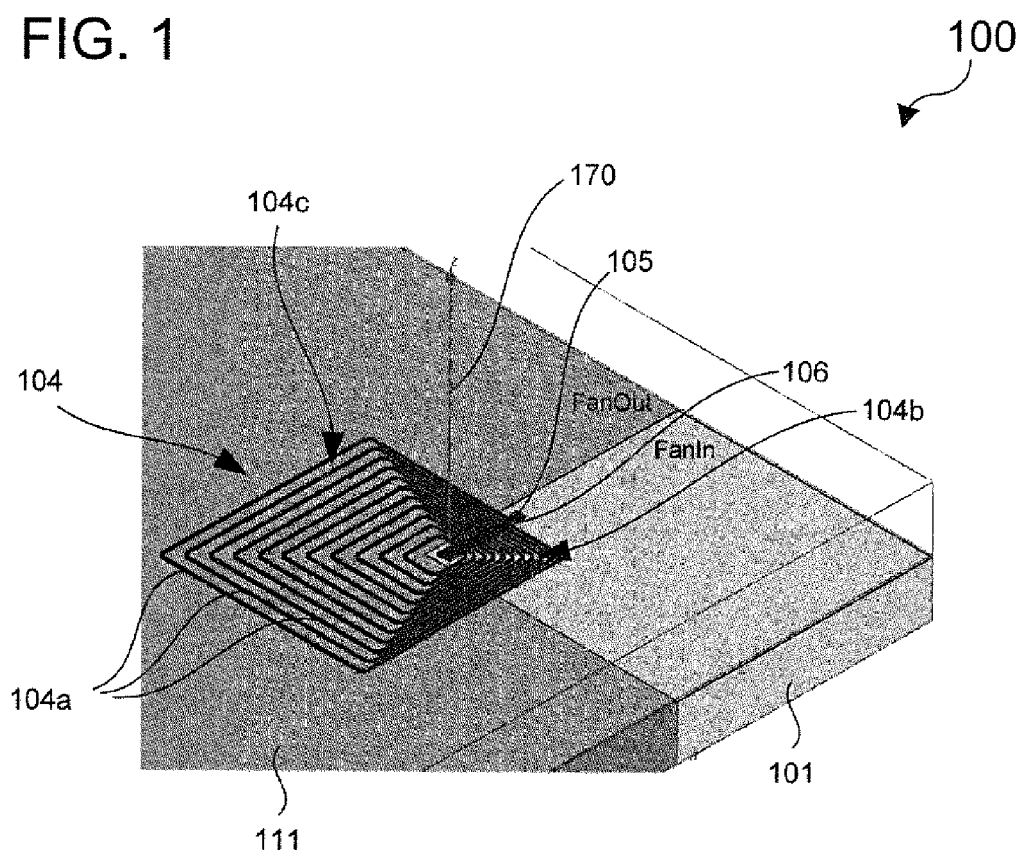
FIG. 1 shows a die arrangement.

In various embodiments, die arrangements may be provided that may include a die, one or more bond pads, and an inductor. In various embodiments, the inductor may be disposed such that it encloses at least one of the bond pads, as well as a redistribution trace or redistribution traces that electrically connect the bond pad(s) with the die. In various embodiments, the inductor or electrical traces of the inductor may be disposed between at least two of the bond pads. In various embodiments, the inductor may be configured as a coil having at least one coil winding that encloses the bond pad or pads.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments. The following detailed description therefore is not to be taken in a limiting sense, and the scope of the present invention is defined by the appended claims.

Various embodiments are provided for devices, and various embodiments are provided for methods. It will be understood that basic properties of the devices also hold for the methods and vice versa. Therefore, for sake of brevity, duplicate description of such properties may be omitted.

The term "at least one" as used herein may be understood to include any integer number greater than or equal to one.

The term "a plurality of" as used herein may be understood to include any integer number greater than or equal to two.

The terms "coupling" or "connection" as used herein may be understood to include a direct "coupling" or direct "connection" as well as an indirect "coupling" or indirect "connection", respectively.

The terms "disposed over", "located over" or "arranged over" as used herein are intended to include arrangements where a first element or layer may be disposed, located or arranged directly on a second element or layer with no further elements or layers in-between, as well as arrangements where a first element or layer may be disposed, located or arranged above a second element or layer with one or more additional elements or layers between the first element or layer and the second element or layer.

The expression "the inductor encloses" as used herein may be understood to indicate that an element or structure is located inside the inductor. For example, in accordance with some embodiments where the inductor is configured as a coil having one or more coil windings the term "enclose" may be understood to indicate that an element or structure is located inside the one or more coil windings of the coil.

The term "bond pad" as used herein may be understood to include, for example, pads that will be contacted in a bonding process (for example, in a wire bonding process, in a flip chip process or in a ball attach process) of a die or chip. In case that a ball attach process is applied, the term "ball pad" may also be used.

The term "redistribution trace" as used herein may be understood to include, for example, conductive lines or traces disposed over a die's or wafer's active surface and used to relocate a bond pad of the die or wafer. In other words, a bond pad's original location over the die or wafer may be shifted to a new location by means of a redistribution trace which may serve as an electrical connection between the (relocated) bond pad at the new location and an electrical contact (or pad) at the original location over the die or wafer.

The term "redistribution layer (RDL)" as used herein may be understood to refer to a layer including a plurality or set of redistribution traces used to relocate ("redistribute") a plurality of bond pads of a die or wafer.

The term "reconstitution structure" as used herein may be understood to include, for example, a structure that may be formed (e.g. cast) around a die to serve as an artificial wafer portion where, for example, additional bond pads may be placed (for example, in addition to bond pads located over the die). Bond pads located over the reconstitution structure may be electrically connected to the die (e.g. to electrical contacts or pads of the die), for example by means of redistribution traces of a redistribution layer. Thus, additional interconnects for a die may be realized over the reconstitution structure (so-called "fan-out design").

The term "embedded wafer level ball grid array (eWLB)" may be understood to refer to a packaging technology for integrated circuits. In an eWLB package, interconnects may be applied on an artificial wafer made of dies or chips (e.g. silicon dies or chips) and a casting compound. eWLB may be seen as a further development of the classical wafer level ball grid array technology (WLB or WLP: wafer level package). For example, all process steps for the generation of the package may be performed on the wafer. This may, for example, allow, in comparison to classical packaging technologies (e.g. ball grid array), the generation of very small and flat packages with improved electrical and thermal performance at decreased cost.

In WLB technologies, which are built on a wafer (e.g. silicon wafer), the interconnects (typically solder balls) usually fit on the chip (so-called fan-in design). Therefore, usually only chips with a restricted number of interconnects may be packaged.

In contrast thereto, the eWLB technology may allow the realization of dies or chips with a high number of interconnects. Here, the package may be realized not on a semiconductor wafer (e.g. silicon wafer) as for classical Wafer Level Package, but on an artificial wafer. To this end, a front-end-processed wafer (e.g. silicon wafer) may, for example, be diced and the singulated chips may be placed on a carrier. The distance between the chips may be chosen freely, but may be typically larger than on the (silicon) wafer. The gaps and the edges around the chips may be filled with a casting compound to form a wafer. After curing, an artificial wafer containing a mold frame around the dies for carrying additional interconnect elements may be realized. After the built of the artificial wafer (the so-called Reconstitution) electrical connections from the chip contacts or pads to the interconnects may, for example, be realized in thin-film technology, like for other classical Wafer Level Package.

With eWLB technology an arbitrary number of additional interconnects may, in principle, be realized on the package in an arbitrary distance (so-called fan-out design). Therefore the eWLB technology may, for example, also be used for space sensitive applications, where the chip area would not be sufficient to place the needed number of interconnects in a realizable distance.

An eWLB may be seen as one example of a so-called fan-out wafer level package. In addition to eWLB, other types of fan-out wafer level packages are known, for example fan-out wafer level packages that are not cast-based or include so-called embedding technologies.

In the fabrication of packages such as for example a laminate package or an embedded wafer level ball grid array (eWLB) it may be desirable to accommodate an inductor, for example a coil, in a redistribution layer (RDL) of the package. Conventionally, in order to accommodate an inductor (e.g. a coil) in a redistribution layer, at least two wiring levels (i.e. at least one additional wiring level) may be needed, plus some space (namely the space taken up by the inductor (e.g. the coil)), as is illustrated in FIG. 1. Both the additional wiring level or levels and the space for the inductor may be costly, the latter particularly in cases where an inductor (e.g. a coil) with large inductivity and/or high quality factor (Q-factor) may be desired.

FIG. 1 shows a die arrangement 100 including a die 101 and a reconstitution structure 111 surrounding the die 101 (only a part of the reconstitution structure 111 is shown for sake of illustration, but the reconstitution structure 111 may completely surround the die 101). An inductur coil 104 having a plurality of windings 104a is formed over a part of the die 101 and also over a part of the reconstitution structure 111. Arrows 104b and 104c indicate a distance between the windings 104a in a fan-in region (arrow 104b) and in a fan-out region (arrow 104c) of the die arrangement 100. A port 105 is disposed between the inductor coil 104 and a top metal layer on the die 101. A bridge 106 is realized in the top metal layer. Axis 170 ("z axis") denotes a direction perpendicular to a main surface of the die 101.

As shown in FIG. 1, in order to accommodate the inductor coil 104, one or more additional wiring levels may be needed, plus the space taken up by the inductor coil 104. Both the additional wiring level(s) and the space for the inductor coil 104 may be costly, the latter particularly in cases, where the inductor coil 104 has a large inductivity and/or high quality factor (Q-factor).

Figure 2:
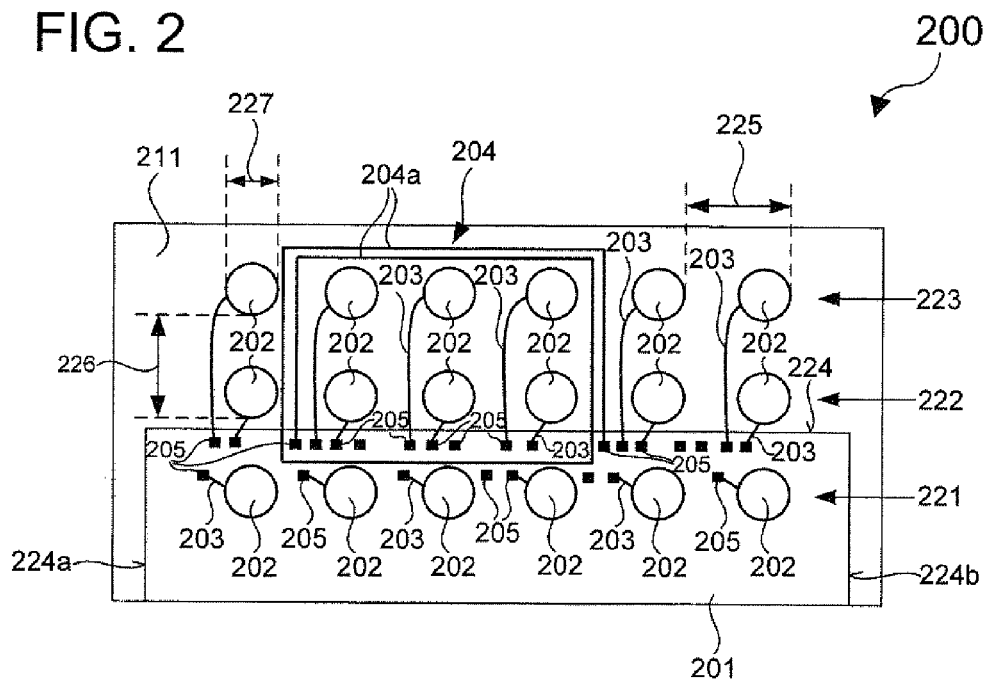
FIG. 2 shows a die arrangement in accordance with an embodiment.

FIG. 2 shows a schematical top view of a die arrangement 200 in accordance with an embodiment.

The die arrangement 200 may include a die 201. The die 201 may, for example, include one or more integrated circuits (IC) including one or more integrated circuit elements (not shown).

The die arrangement 200 may further include a reconstitution structure 211. The reconstitution structure 211 may surround the die 201 at least partially. In some embodiments, the reconstitution structure 211 may surround the die 201 completely. In this context, the term "surround" may be understood to indicate that the reconstitution structure 211 may abut some or all of the lateral surfaces 224, 224a, 224b of the die 201 (as shown in FIG. 2) and, in accordance with some embodiments, also a surface of the die 201 that is opposite to a surface, over which bond pads 202 are located, while the surface, over which the bond pads 202 are located, may be free from the reconstitution structure 211.

In various embodiments, the reconstitution structure 211 may include or may be made of a mold compound.

In various embodiments, the reconstitution structure 211 may be configured as a mold frame.

The die arrangement 200 may further include a plurality of bond pads 202. Some of the bond pads 202 may be disposed over the reconstitution structure 211 while some other of the bond pads 202 may be disposed over the die 201, as shown. The bond pads 202 may be arranged in rows as indicated by arrows 221, 222, 223. In the embodiment shown, one row 221 of bond pads 202 is arranged over the die 201, while two rows (a first row 222 and a second row 223) of bond pads 202 are arranged over the reconstitution structure 211.

The rows 221, 222, 223 may run substantially parallel (or parallel) to an interface 224 between the die 201 and the reconstitution structure 211. The interface 224 may clearly correspond to one of the lateral surfaces 224, 224a, 224b of the die 201, as shown. As shown, the first row 222 of bond pads 202 arranged over the reconstitution structure 211 may be disposed proximate to (in other words, near) the interface 224 between the die 201 and the reconstitution structure 211. In other words, the bond pads 202 in the first row 222 may be arranged proximate to (near) the interface 224. In still other words, of all the bond pads 202 disposed over the reconstitution structure 211, the bond pads 202 in the first row 222 may be nearest to the interface 224, while the bond pads 202 in the second row 223 may be farther away from the interface 224. In still other words, the second row 223's distance from the interface 224 between the die 201 and the reconstitution structure 211 may be greater than the first row 222's distance from the interface 224 between the die 201 and the reconstitution structure 211.

In accordance with the embodiment shown, each of the rows 221, 222, 223 includes six bond pads 202. As will be readily understood, the number of rows as well as the number of bond pads in each row is only exemplary and a different number of rows and/or a different number of bond pads per row may be provided in accordance with other embodiments. Also, the number of rows disposed over the die 201 and/or the number of rows disposed over the reconstitution structure 211 may be different in accordance with other embodiments.

In various embodiments, neighboring bond pads 202 in a row and/or neighboring bond pads 202 of two adjacent rows may be spaced apart by a distance of approximately 100 µm to approximately 2540 µm, for example by a distance of approximately 250 µm to approximately 750 µm, for example by a distance of approximately 300 µm to approximately 600 µm, for example by a distance of approximately 500 µm. In other words, a pitch of neighboring bond pads 202 in a row (denoted by arrow 225 in FIG. 2) and/or a pitch of neighboring bond pads 202 of two adjacent rows (denoted by arrow 226 in FIG. 2) may have a value as described above. In accordance with other embodiments, the pitch 225 and/or the pitch 226 may have other values.

The value of the pitch 225 may be the same as or may be different from the value of the pitch 226.

In various embodiments, the bond pads 202 may, for example, have a circular shape (as shown in FIG. 2), an ellipsoidal shape, or a polygonal shape such as e.g. a triangular shape, a quadratic shape, or a rectangular shape. In accordance with other embodiments, the bond pads 202 may have a different shape.

In accordance with an embodiment, a bond pad diameter (denoted by arrow 227 in FIG. 2) may be in the range from approximately 50 µm to approximately 1750 µm, for example in the range from approximately 50 µm to approximately 750 µm, for example in the range from approximately 100 µm to approximately 500 µm, for example in the range from approximately 200 µm to approximately 300 µm, for example about 260 µm. In accordance with other embodiments, the bond pad diameter 227 may have other values.

The die arrangement 200 further includes a plurality of redistribution traces 203 electrically connecting the die 201 with the plurality of bond pads 202. As shown, each bond pad 202 may be connected to the die 201 via a respective one of the plurality of redistribution traces 203.

In various embodiments, the plurality of redistribution traces 203 may include or may be made of electrically conductive material such as, for example, metal.

In various embodiments, a trace width of the redistribution traces 203 may be in the range from approximately 1 µm to approximately 50 µm, for example in the range from approximately 3 µm to approximately 20 µm in accordance with some embodiments, for example in the range from approximately 6 µm to approximately 15 µm in accordance with some embodiments, for example about 7 µm in accordance with an embodiment. In accordance with other embodiments, the trace width may have other values.

In various embodiments, a trace thickness of the redistribution traces 203 may be on the order of several µm or several tens of µm, for example in the range from approximately 5 µm to approximately 35 µm in accordance with some embodiments, for example in the range from approximately 8 µm to approximately 30 µm in accordance with some embodiments, e.g. about 8 µm in accordance with an embodiment, or about 15 µm in accordance with another embodiment, or about 20 µm in accordance with another embodiment, or about 30 µm in accordance with another embodiment. However, in accordance with other embodiments, the trace thickness may have other values.

Illustratively, the plurality of redistribution traces 203 may be part of a redistribution layer (RDL) of the die arrangement 200. The redistribution layer may be disposed partly over the die 201 and partly over the reconstitution structure 211.

As shown, the die 201 may include a plurality of electrical contacts 205. The electrical contacts 205 may, for example, be electrically connected (e.g. via one or more metallization levels in the die 201) to one or more integrated circuit elements of the die 201 (not shown).

As shown, each redistribution trace 203 may be connected, with one end, to one of the electrical contacts 205 of the die 201 and, with another end, to a bond pad 202, thereby electrically connecting the die 201 (or one or more integrated circuit elements of the die 201) with that bond pad 202.

It should be noted that, in accordance with some embodiments, one or more of the electrical contacts 205 of the die 201 need not be connected to a redistribution trace 203 or bond pad 202, as shown. In other words, one or more of the electrical contacts 205 may be unused. Furthermore, two of the electrical contacts 205 may be connected to an inductor 204 disposed in the redistribution layer (RDL) level, as will be described below.

The die arrangement 200 may further include an inductor 204 that encloses some of the bond pads 202 disposed over the reconstitution structure 211 and also encloses the corresponding redistribution traces 203 that electrically connect the enclosed bond pads 202 with the die 201. Furthermore, the inductor 204 also encloses those electrical contacts 205 that are connected to the enclosed redistribution traces 203. As shown, those electrical contacts 205 may be located proximate to the interface 224 between the die 201 and the reconstitution structure 211.

In accordance with the embodiment shown, the inductor 204 encloses six bond pads 202 disposed over the reconstitution structure 211, three of which are arranged in the first row 222 and the other three are arranged in the second row 223 of bond pads 202. In accordance with other embodiments, the inductor 204 may enclose a different number of bond pads 202 in the first row 222 and/or a different number of bond pads 202 in the second row 223. Furthermore, in accordance with some embodiments, the inductor 204 may also enclose some of the bond pads 202 disposed over the die 201.

In accordance with the embodiment shown, the inductor 204 is configured as a coil having a plurality of windings 204a, as shown. Therefore, the inductor 204 will also be referred to as inductor coil or, short, coil in the following.

As shown, the ends of the inductor coil 204 are in each case electrically connected to one of the electrical contacts 205. Furthermore, one of the electrical contacts 205 that is connected to the coil 204 is enclosed by the coil windings 204a, as shown.

In accordance with the embodiment shown, one of the coil windings 204a is a complete winding while another one of the windings 204a is incomplete. In accordance with other embodiments, the inductor coil 204 may have a different number of coil windings 204a. For example, the inductor coil 204 may have more than one complete winding 204a (e.g. two, three, four, . . . , etc. complete coil windings 204a).

Illustratively, the windings 204a of the inductor coil 204 may enclose some of the bond pads 202, the corresponding redistribution traces 203 connecting the enclosed bond pads 202 with the die 201 and the corresponding electrical contacts 205 of the die 201, as shown.

Furthermore, the windings 204a of the inductor coil 204 may enclose one of the electrical contacts 205 that is connected to the inductor coil 204 (illustratively, that contact 205 that is located inside the coil windings 204a), as shown.

In various embodiments, the coil windings 204a may include or may be made of electrically conductive material such as, for example, metal.

In various embodiments, the coil windings 204a may run substantially parallel (or parallel) to a main surface of the die 201, for example substantially parallel (or parallel) to an upper surface or active surface of the die 201. Illustratively, the main surface of the die 201 may be that surface of the die 201, over which the bond pads 202 are disposed.

Illustratively, in various embodiments the inductor coil 204 may be disposed in the redistribution layer (RDL) of the die arrangement 200. The coil windings 204a may, for example, be formed from the same material (e.g. the same metal material) as the redistribution traces 203. For example, in accordance with some embodiments, the redistribution traces 203 and the inductor coil 204 may be formed by means of the same metallization process.

In the die arrangement 200, traces of an inductor coil 204 may be located between bond pads 202. All pads 202 (including those pads 202 that are located inside the coil 204) may be electrically connected (and thus used), and no area is "wasted" by the coil 204. Loop closing of the coil 204 may be achieved over the die 201, using, for example, IC or RDL metal or both.

In various embodiments, a trace width of the inductor coil 204 (clearly, of electrical traces forming the windings 204a of the inductor coil 204) may be in the range from approximately 1 µm to approximately 50 µm, for example in the range from approximately 6 µm to approximately 20 µm in accordance with some embodiments, for example in the range from approximately 6 µm to approximately 15 µm in accordance with some embodiments, for example about 7 µm in accordance with an embodiment. In accordance with other embodiments, the trace width may have other values.

In various embodiments, a trace width of the inductor coil 204 may be the same or approximately the same as a trace width of the redistribution traces 203. In accordance with other embodiments, the trace width of the inductor coil 204 may be different from the trace width of the redistribution traces 203.

In various embodiments, a trace thickness of the inductor coil 204 (clearly, of electrical traces forming the windings 204a of the inductor coil 204) may be on the order of several µm or several tens of µm, for example in the range from approximately 5 µm to approximately 35 µm in accordance with some embodiments, for example in the range from approximately 8 µm to approximately 30 µm in accordance with some embodiments, e.g. about 8 µm in accordance with an embodiment, or about 15 µm in accordance with another embodiment, or about 20 µm in accordance with another embodiment, or about 30 µm in accordance with another embodiment. However, in accordance with other embodiments, the trace thickness may have other values.

In various embodiments, a trace thickness of the inductor coil 204 may be the same or approximately the same as a trace thickness of the redistribution traces 203. In accordance with other embodiments, the trace thickness of the inductor coil 204 may be different from the trace thickness of the redistribution traces 203.

In various embodiments, the die arrangement 200 may be configured as a fan-out package, for example as a fan-out wafer level package such as, for example, an embedded wafer level ball grid array (eWLB), alternatively as other type of fan-out wafer level package, e.g. as a fan-out wafer level package that is not cast-based or includes so-called embedding technologies.

Figure 3:
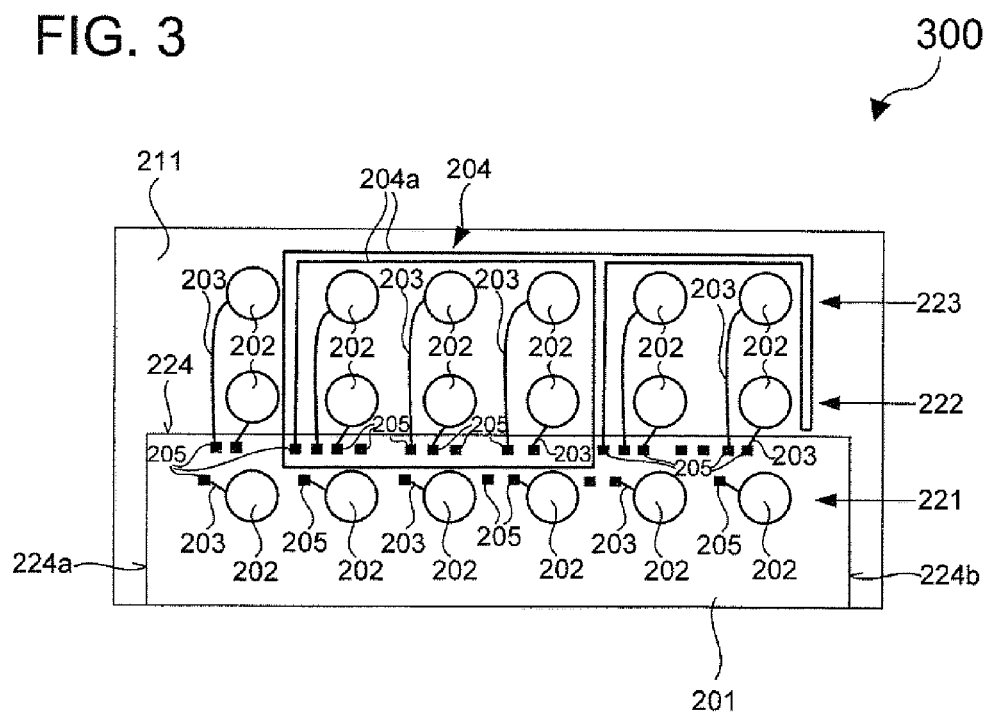
FIG. 3 shows a die arrangement in accordance with another embodiment.

FIG. 3 shows a schematical top view of a die arrangement 300 in accordance with another embodiment.

The die arrangement 300 is to some extent similar to the die arrangement 200 shown in FIG. 2. Parts that are the same as in the die arrangement 200 are labelled with the same reference numerals and will not be described in detail again. Reference is made to the description above for the sake of brevity.

The die arrangement 300 differs from the die arrangement 200 mainly in that the inductor coil 204 has a different shape. In the die arrangement 300, the traces of the inductor coil 204 lead around four additional bond pads 202, namely the two rightmost bond pads 202 in the first row 222 and the two rightmost bond pads 202 in the second row 223. These bond pads 202 may still be electrically connected to the die 201 via corresponding redistribution traces 203 and electrical contacts 205, as shown.

Compared to the inductor coil 204 of the die arrangement 200, the inductor coil 204 of the die arrangement 300 may, for example, have a different inductance value and/or a different Q-factor value.

Figure 4:
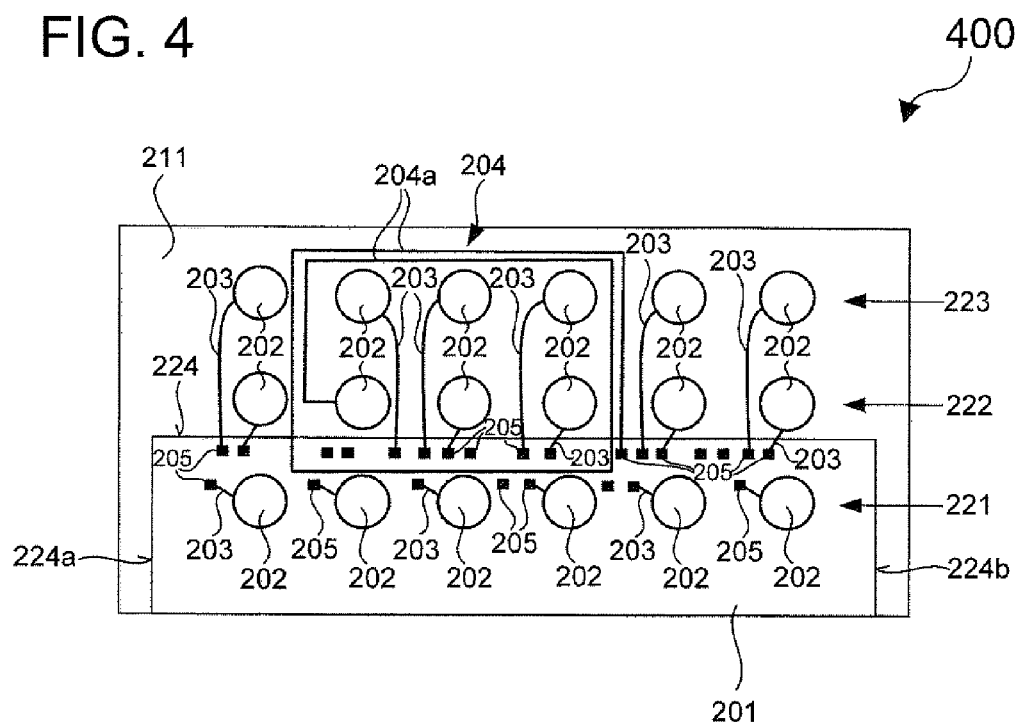
FIG. 4 shows a die arrangement in accordance with another embodiment.

FIG. 4 shows a schematical top view of a die arrangement 400 in accordance with another embodiment.

The die arrangement 400 is to some extent similar to the die arrangement 200 shown in FIG. 2. Parts that are the same as in the die arrangement 200 are labelled with the same reference numerals and will not be described in detail again. Reference is made to the description above for the sake of brevity.

The die arrangement 400 differs from the die arrangement 200 mainly in that the inductor coil 204 is electrically connected to one of the bond pads 202 enclosed by (in other words, located inside) the inductor coil 204 (in accordance with the embodiment shown, the inductor coil 204 is connected to the second bond pad 202 from the left in the first row 222, however in accordance with other embodiments the inductor coil 204 may be connected to other bond pads 202). In accordance with this embodiment, feed-in of the inductor coil 204 may be achieved via an external ball bonded to the bond pad 202 the coil 204 is connected to.

Figure 5:
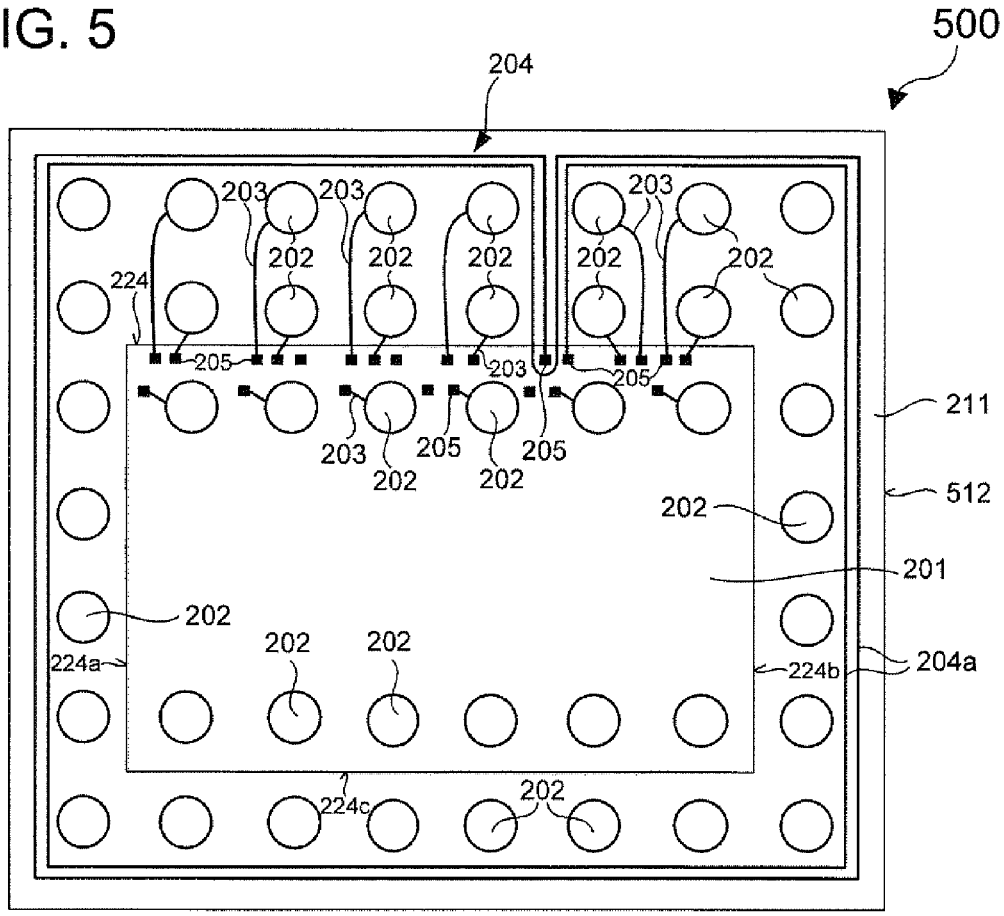
FIG. 5 shows a die arrangement in accordance with another embodiment.

FIG. 5 shows a schematical top view of a die arrangement 500 in accordance with another embodiment.

The die arrangement 500 is to some extent similar to the die arrangement 200 shown in FIG. 2. Parts that are the same as in the die arrangement 200 are labelled with the same reference numerals and will not be described in detail again. Reference is made to the description above for the sake of brevity.

The die arrangement 500 may include a die 201 and a reconstitution structure 211 surrounding the die 201. The reconstitution structure 211 may abut the lateral surfaces 224, 224a, 224b and 224c of the die 201, as shown. In addition, the reconstitution structure 211 may abut a surface of the die 201 that is opposite to a surface over which bond pads 202 are disposed (not shown), in accordance with some embodiments.

The die arrangement 500 may include a plurality of bond pads 202. Some of the plurality of bond pads 202 may be disposed over the die 201 and some of the plurality of bond pads 202 may be disposed over the reconstitution structure 211.

The die arrangement 500 may include a plurality of redistribution traces 203. The die 201 may include a plurality of electrical contacts 205.

Some or all of the bond pads 202 may be electrically connected to respective electrical contacts 205 by means of respective redistribution traces 203 (only some of the electrical contacts 205 of the die 201 and some of the redistribution traces 203 connecting the die 201 to the bond pads 202 are shown in the figure for simplicity).

The die arrangement 500 may include an inductor 204 that may be configured as a coil including a plurality of coil windings 204a (two coil windings 204a are shown in the figure, however a different number of coil windings 204a may be present in accordance with other embodiments). The inductor (coil) 204 may be connected with its ends to two electrical contacts 205 of the die 201. In accordance with an embodiment, the two electrical contacts 205 may be located proximate to an interface 224 between the die 201 and the reconstitution structure 211. The interface 224 may correspond to one of the lateral surfaces 224, 224a, 224b and 224c of the die 201, as shown.

The inductor (coil) 204 may be disposed such that it encloses all of the bond pads 202 and all of the redistribution traces 203 connecting the bond pads 202 to the die 201. Clearly, in accordance with the embodiment shown, the inductor (coil) 204 may be disposed such that its coil windings 204a may run along a periphery of the reconstitution structure 211. In other words, the coil windings 204a may be disposed over the reconstitution structure 211 in a peripheral or edge region of the reconstitution structure 211 that may be located between the outermost bond pads 202 and an edge 512 of the reconstitution structure 211. As shown in the figure, a section of the coil windings 204a that leads to the electrical contacts 205 of the die 201 may be located between some of the plurality of bond pads 202.

In the die arrangement 500, all bond pads 202 may be used and no area is "wasted" by the inductor (coil) 204. Loop closing of the inductor (coil) 204 may, for example, be achieved by an integrated circuit (IC) of the die 201 (not shown).

One effect of the die arrangement 500 may be that maximum inductance may be achieved by an inductor (coil) 204 surrounding the whole array of bond pads 202.

Figure 6:
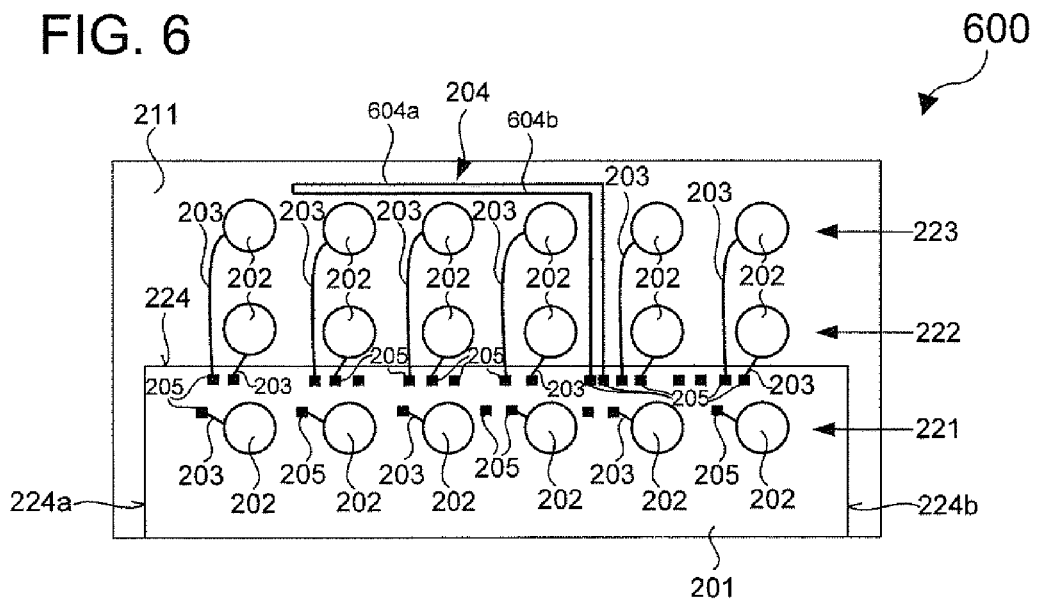
FIG. 6 shows a die arrangement in accordance with another embodiment.

FIG. 6 shows a schematical top view of a die arrangement 600 in accordance with another embodiment.

The die arrangement 600 is to some extent similar to the die arrangement 200 shown in FIG. 2. Parts that are the same as in the die arrangement 200 are labelled with the same reference numerals and will not be described in detail again. Reference is made to the description above for the sake of brevity.

The die arrangement 600 differs from the die arrangement 200 mainly in that the inductor 204 has a different shape. In accordance with the embodiment shown, the inductor 204 includes a first electrical trace 604a and a second electrical trace 604b that run substantially parallel to one another. The first and second electrical traces 604a, 604b may be disposed such that the main current flow direction in the first electrical trace 604a is substantially anti-parallel to the main current flow direction in the second electrical trace 604b. As shown, a first part of the inductor 204 (more precisely, a first part of the first and second electrical traces 604a, 604b of the inductor 204) may be disposed between some of the bond pads 202 (in accordance with the embodiment shown, the first part is disposed between the first row 222's second and third bond pads 202 from the right and between the second row 223's second and third pond pads 202 from the right; however, the first part may be disposed between other bond pads 202) and may run substantially perpendicular to the rows 221, 222, 223 of bond pads, while a second part of the inductor 204 (more precisely, a second part of the first and second electrical traces 604a, 604b of the inductor 204) may run substantially parallel to the rows of bond pads 221, 222, 223. For example, the first part and the second part of the inductor 204 may be at right angles to one another. Thus, illustratively, the inductor 204 may have the shape of a mirrored "L". As will be readily understood, the inductor 204 may have different shapes in accordance with other embodiments.

As shown, a first end of the inductor 204 may be connected to a first one of the electrical contacts 205 of the die 201, and a second end of the inductor 204 may be connected to a second one of the electrical contacts 205 of the die 201.

In the die arrangement 600 traces 604a, 604b of an inductor coil 204 may be located between bond pads 202. All pads 202 may be electrically connected (and thus used), and no area is "wasted" by the coil 204. Loop closing of the coil 204 may, for example, be achieved by an integrated circuit (IC) of the die 201 (not shown).

Figure 7:
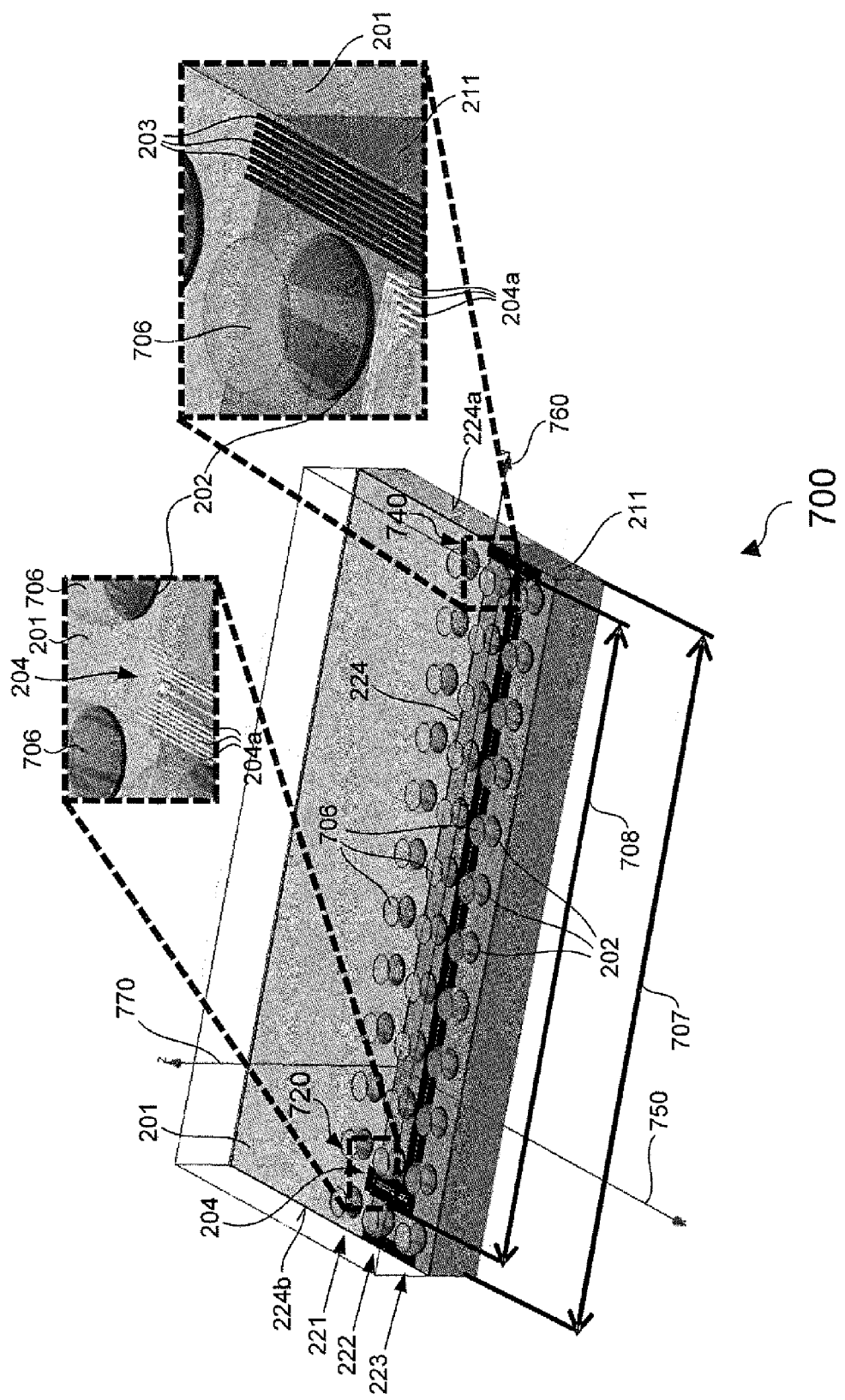
FIG. 7 shows a die arrangement in accordance with another embodiment.

FIG. 7 shows a schematical perspective view of a die arrangement 700 in accordance with another embodiment. Also shown are blow-ups of a first portion 720 and a second portion 740 of the die arrangement 700.

The die arrangement 700 is to some extent similar to the die arrangements described herein above in connection with FIGS. 2 to 6. Parts that are the same as in the die arrangements of FIGS. 2 to 6 are labelled with the same reference numerals and will not be described in detail again. Reference is made to the description above for the sake of brevity.

The die arrangement 700 includes a die 201, a reconstitution structure 211, and a plurality of bond pads 202 arranged in parallel rows 221, 222, 223. One row 221 is disposed over the die 201, and two rows (a first row 222 and a second row 223) are disposed over the reconstitution structure 211. Each one of the rows 221, 222, 223 of bond pads 202 includes, as an example, twelve bond pads 202. As will be readily understood, a different number of rows and/or a different number of bond pads per row may be provided in accordance with other embodiments.

Axis 750 ("x axis") denotes a direction in the plane of a main surface of the die 201 and perpendicular to the rows 221, 222, 223 of bond pads 202, axis 760 ("y axis") denotes a direction in the plane of the main surface of the die 201 and parallel to the rows 221, 222, 223 of bond pads 202, and axis 770 ("z axis") denotes a direction perpendicular to the main surface of the die 201. Clearly, axes 750, 760, 770 are perpendicular to one another.

The bond pads 202 may be contacted in a bonding process, e.g. a ball attach process in accordance with an embodiment, which is indicated by the outlines of balls 706 disposed over the bond pads 202, as shown in FIG. 7.

An inductor 204 is disposed between the bond pads 202. The inductor 204 is configured as a coil including a plurality of coil windings 204a as may be seen in the blow-ups of portions 720 and 740 of the die arrangement 700 (seven coil windings 204a are shown as an example; however, in accordance with other embodiments, the number of coil windings 204a may be different). Illustratively, in accordance with the embodiment shown the coil 204 has the shape of a mirrored "L" with one portion of the coil 204 (clearly, the longer side of the mirrored "L") being disposed between the first row 222 of bond pads 202 and the second row 223 of bond pads 202 and another portion of the coil 204 (clearly, the shorter side of the mirrored "L") being disposed between the first bond pad 202 and the second bond pad 202 from the left in the first row 222.

The bond pads 202 may be electrically connected to the die 201 (e.g. to electrical contacts (not shown) of the die 201) by means of redistribution traces 203. In FIG. 7, only some of the redistribution traces 203 are shown, namely those that may be used to route the bond pads 202 (or balls) in the second row 223 of bond pads 202 disposed over the reconstitution structure 211. As is shown in the blow-up of portion 740, the die arrangement 700 may be configured such that space for a plurality of conductive lines (redistribution traces 203) may be provided at edges of the die arrangement 700 for routing bond pads 202 (or balls) in the second row 223.

In FIG. 7, eight redistribution traces 203 are shown in the blow-up of portion 740 as an example, however, as will be readily understood, the number of redistribution traces 203 that may be accommodated at an edge of the die arrangement 700 may be different from eight and may be dependent, for example, on the trace width of the redistribution traces 203, the distance between neighboring redistribution traces 203 and the distance between the edge and the bond pads 202 nearest to the edge.

In FIG. 7, an arrow 707 indicates a dimension of the die arrangement 700 in a direction parallel to the rows 221, 222, 223 of bond pads 202 (i.e. parallel to the "y axis" 760). Furthermore, an arrow 708 indicates a dimension of the longer portion of the "L" shaped coil 204 in the direction parallel to the rows 221, 222, 223 (i.e. parallel to the "y axis" 760). In the following, arrow 708 will also be referred to as the "inductor length".

Figure 8:
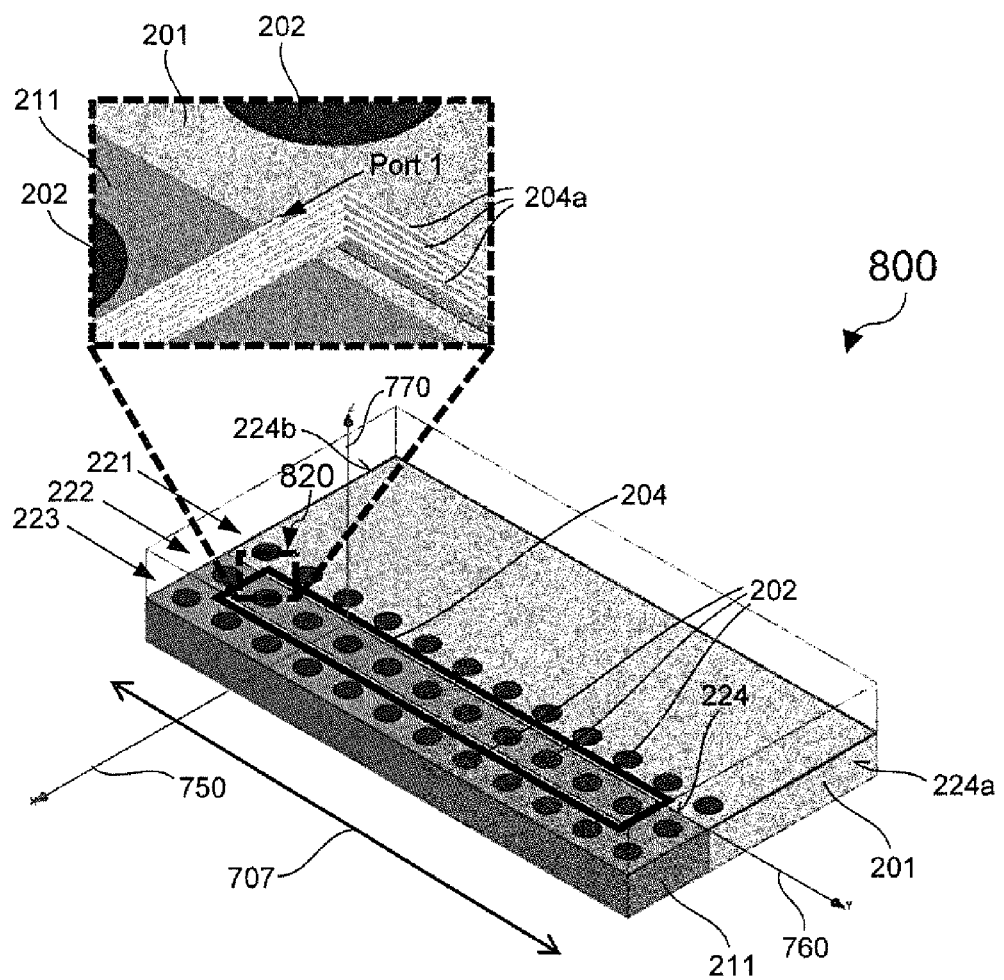
FIG. 8 shows a die arrangement in accordance with another embodiment.

FIG. 8 shows a schematical perspective view of a die arrangement 800 in accordance with another embodiment. Also shown is a blow-up of a portion 820 of the die arrangement 800.

The die arrangement 800 is to some extent similar to the die arrangements described herein above in connection with FIGS. 2 to 7. Parts that are the same as in the die arrangements of FIGS. 2 to 7 are labelled with the same reference numerals and will not be described in detail again. Reference is made to the description above for the sake of brevity.

In the die arrangement 800, an inductor coil 204 having six coil windings 204a is disposed such that the coil windings 204a enclose some of the bond pads 202 of the first row 222 of bond pads 202 disposed over the reconstitution structure 211. In accordance with the embodiment shown, the coil windings 204a enclose ten bond pads 202 of the twelve bond pads 202 disposed in the first row 222. Clearly, in accordance with the embodiment shown, the coil windings 204a enclose all of the bond pads 202 in the first row 222 except for the leftmost bond pad 202 and the rightmost bond pad 202 in the first row 222. In accordance with other embodiments, the inductor coil 204 may be disposed such that its windings 204a enclose a different number of bond pads 202 in the first row 222. Furthermore, in accordance with other embodiments, the inductor coil 204 may have a different number of windings 204a.

The bond pads 202 in the first row 222 that are enclosed by the inductor coil 204 may be electrically connected to the die 201 (e.g. to electrical contacts of the die 201 (not shown)) by means of redistribution traces (not shown) that are also enclosed by the inductor coil 204. Thus, all bond pads 202 (including those that are enclosed by the inductor coil 204) may be used. The inductor coil 204 may be electrically connected to electrical contacts of the die 201 (not shown), one of which may be enclosed by the coil windings 204a. In the blow-up of portion 820, one end of the coil 204 is labelled by arrow "Port 1" to indicate that electric characteristics of the coil 204 may be modelled within the framework of a two-port network, as described further below.

In the die arrangement 800, routing of the bond pads 202 in the second row 223 may, for example, be achieved by means of redistribution traces that run at the edges of the die arrangement 800, for example in a similar manner as in the die arrangement 700 shown in FIG. 7.

Figure 9:
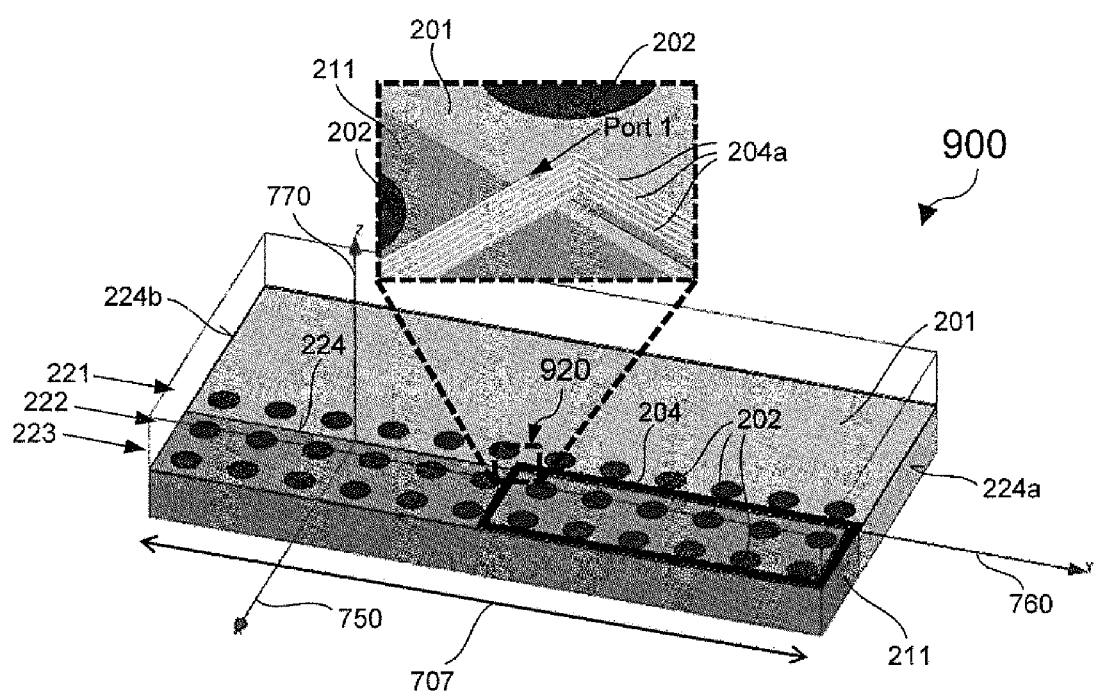
FIG. 9 shows a die arrangement in accordance with another embodiment.

FIG. 9 shows a schematical perspective view of a die arrangement 900 in accordance with another embodiment. Also shown is a blow-up of a portion 920 of the die arrangement 900.

The die arrangement 900 is to some extent similar to the die arrangements described herein above in connection with FIGS. 2 to 8. Parts that are the same as in the die arrangements of FIGS. 2 to 8 are labelled with the same reference numerals and will not be described in detail again. Reference is made to the description above for the sake of brevity.

In the die arrangement 900, an inductor coil 204 including six coil windings 204a is disposed such that the coil windings 204a enclose some of the bond pads 202 of the first row 222 of bond pads 202 and the second row 223 of bond pads 202 disposed over the reconstitution structure 211. In accordance with the embodiment shown, the coil windings 204a enclose six bond pads 202 of the twelve bond pads 202 disposed in the first row 222 as well as six bond pads 202 of the twelve bond pads 202 disposed in the second row 223. Illustratively, the coil windings 204a enclose "the right half" of the bond pads 202 in the first row 222 and the second row 223. In accordance with other embodiments, the inductor coil 204 may be disposed such that its windings 204a enclose a different number of bond pads 202 in the first row 222 and/or in the second row 223. Furthermore, in accordance with other embodiments, the inductor coil 204 may have a different number of windings 204a.

The bond pads 202 in the first row 222 and in the second row 223 that are enclosed by the inductor coil 204 may be electrically connected to electrical contacts of the die 201 (not shown) by means of redistribution traces (not shown) that are also enclosed by the inductor coil 204. Thus, all bond pads 202 (including those that are enclosed by the inductor coil 204) may be used. The inductor coil 204 may be electrically connected to electrical contacts of the die 201 (not shown), one of which may be enclosed by the coil windings 204a.

In the die arrangement 900, routing of bond pads 202 in the second row 223 that are not enclosed by the coil 204 may be facilitated as the coil 204 encloses only half of the bond pads 202 in the first row 222 and in the second row 223 so that there may be more space left for redistribution traces leading to the non-enclosed bond pads 202 in the second row 223.

In the foregoing embodiments, die arrangements with only one inductor have been shown as examples. However, as will be readily understood, more than one inductor may be provided in a die arrangement in accordance with various embodiments. Furthermore, the number of bond pads, the number of rows of bond pads, the number of bond pads per row, the number of coil windings of an inductor coil, the number of enclosed bond pads, the dimensions (e.g. bond pad diameter, trace width, inductor length, pitches, etc.) are only exemplary. As will be readily understood, one or more of the aforementioned features or parameters may have other values in accordance with various embodiments.

In accordance with various embodiments, inductor coils with a multitude of different shapes may be arranged between bond pads in a redistribution layer (RDL) of a die arrangement. Clearly, by varying the shape of the inductor coil, the inductance and/or the Q-factor of the inductor coil may, for example, be adjusted. For example, reducing the inductor size may lead to smaller inductance values. Traces or windings of the coil may be located between the bond pads of the die arrangement and, in accordance with some embodiments, one or more of the bond pads may be enclosed by one or more coil windings. In case that bond pads are enclosed by the coil it may be provided that corresponding electrical contacts of the die and corresponding redistribution traces are also enclosed by the coil so that the enclosed bond pads may be electrically connected to the die. Thus, in accordance with various embodiments, an inductor coil may be placed in the redistribution layer (RDL) in such a manner that no extra space may be needed for the coil and that all bond pads may be electrically connected.

In the die arrangements in accordance with embodiments described herein, an additional wiring level to electrically connect an inductor coil may be spared. Pads enclosed by the inductor coil may be electrically connected via electrical contacts and redistribution traces that are also enclosed by the inductor coil. In accordance with various embodiments, an end of the inductor coil that is enclosed by the windings of the coil may be connected either to an electrical contact of the die or to a pad also enclosed by the windings of the coil. Illustratively, one end of the coil may be electrically connected via an electrical contact or pad located "inside" the coil. Thus, in accordance with various embodiments, an inductor coil may be fully accommodated and electrically connected using only one wiring level (the redistribution layer level) of a die arrangement.

By means of simulation, values for inductance L and quality factor (Q-factor) Q of an inductor, for example an inductor coil such as the inductor coil 204 of the die arrangements shown in FIGS. 2 to 9, may be obtained.

Figure 10:
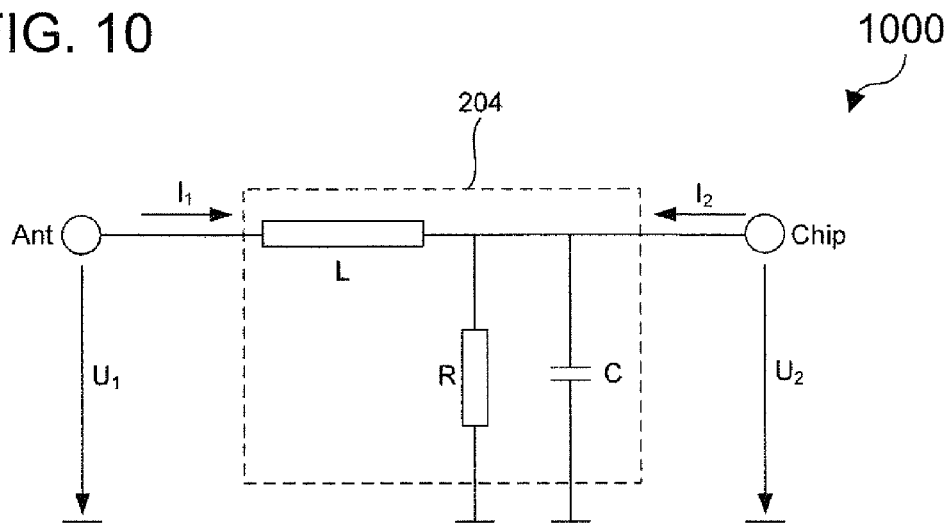
FIG. 10 shows an equivalent circuit diagram of an inductor that may be used in accordance with various embodiments.

For example, the inductor coil 204 may be modelled in the framework of a two-port network, as shown in the equivalent circuit diagram 1000 in FIG. 10. In the diagram 1000, "Ant" denotes an input terminal corresponding to a first port ("Port 1") of the two-port network, "Chip" denotes an output terminal corresponding to a second port ("Port 2") of the two-port network, $U_1$ and $I_1$ denote input voltage and input current at the input terminal "Ant", $U_2$ and $I_2$ denote output voltage and output current at the output terminal "Chip", and L, R and C denote inductance, resistance and capacitance of the inductor coil 204 in the two-port network.

For the two-port network in FIG. 10, it holds $$\begin{pmatrix} U_1 \\ U_2 \end{pmatrix} = \begin{pmatrix} Z_{11} & Z_{12} \\ Z_{21} & Z_{22} \end{pmatrix} \cdot \begin{pmatrix} I_1 \\ I_2 \end{pmatrix},$$

where $$Z = \begin{pmatrix} Z_{11} & Z_{12} \\ Z_{21} & Z_{22} \end{pmatrix}$$

is the Z-parameter matrix (impedance matrix) with $$Z_{11} = \frac{U_1}{I_1}\bigg|_{I_2=0},\ Z_{12} = \frac{U_1}{I_2}\bigg|_{I_1=0},\ Z_{21} = \frac{U_2}{I_1}\bigg|_{I_2=0},\ Z_{22} = \frac{U_2}{I_2}\bigg|_{I_1=0}.$$

The inductance L and the Q-factor of coil 204 may be obtained as $$L = Im(Z_{11})/(2\pi f)$$

and $$Q = Im(Z_{11})/Re(Z_{11}),$$

where $Re(Z_{11})$ and $Im(Z_{11})$ denote, respectively, real part and imaginary part of $Z_{11}$ and f denotes the signal frequency.

Exemplary simulations have been carried out for inductor coils in accordance with various embodiments described herein and for signal frequencies in the range from about 70 MHz to about 250 MHz. Simulation results reveal that, in accordance with some embodiments, values of the inductance (L) may, for example, be in the range from about 30 nH to about 400 nH and values of the Q-factor (Q) may, for example, be in the range from about 5 to about 17. The values of L and/or Q may, for example, depend on a number of device parameters, such as for example size of the inductor, number of coil windings, trace width, trace thickness, etc. For example, in accordance with some embodiments, higher values of inductance L and/or Q-factor may be achieved by increasing the size of the inductor.

As an example, with respect to the die arrangement 700 of FIG. 7, the inductance L and/or the Q-factor of the inductor coil 204 in the die arrangement 700 may be adjusted, for example, by variation of the inductor length 708. As will be readily understood, similar adjustments of L and Q may be achieved in die arrangements in accordance with other embodiments by means of similar variation of one or more device parameters.

An inductor (e.g. inductor coil) in a die arrangement in accordance with various embodiments may have an influence on a bond pad or ball enclosed by the inductor and/or on a bond pad or ball disposed outside the inductor but proximate to the inductor. In order to determine, for example, the inductor coil's influence on a bond pad or ball that is enclosed by the inductor coil, the inductor coil may be modelled within the framework of a two-port network.

In this connection, the inductor coil's influence on the enclosed bond pad or ball and the redistribution layer (RDL) and metal top routing in the die arrangement may be represented by the S-parameter $S_{21}$ (forward voltage gain) of the corresponding S-matrix (scattering matrix) of the corresponding two-port network.

Simulation results for an exemplary die arrangement reveal that for frequencies up to approximately 1 GHz, $S_{21}$ may be smaller than −50 dB. It should be noted that $S_{21}$ may depend on RDL and metal top routing.

Similarly, the inductor coil's influence on a bond pad or ball located proximate to (but outside) the coil, and on the redistribution layer (RDL) and metal top routing in the die arrangement may be represented by the S-parameter $S_{21}$ (forward voltage gain) of the corresponding S-matrix (scattering matrix) of the corresponding two-port network.

Simulation results for an exemplary die arrangement reveal that for frequencies up to approximately 10 GHz, $S_{21}$ may be below −55 dB. It should be noted that $S_{21}$ may depend on RDL and metal top routing.

Figure 11:
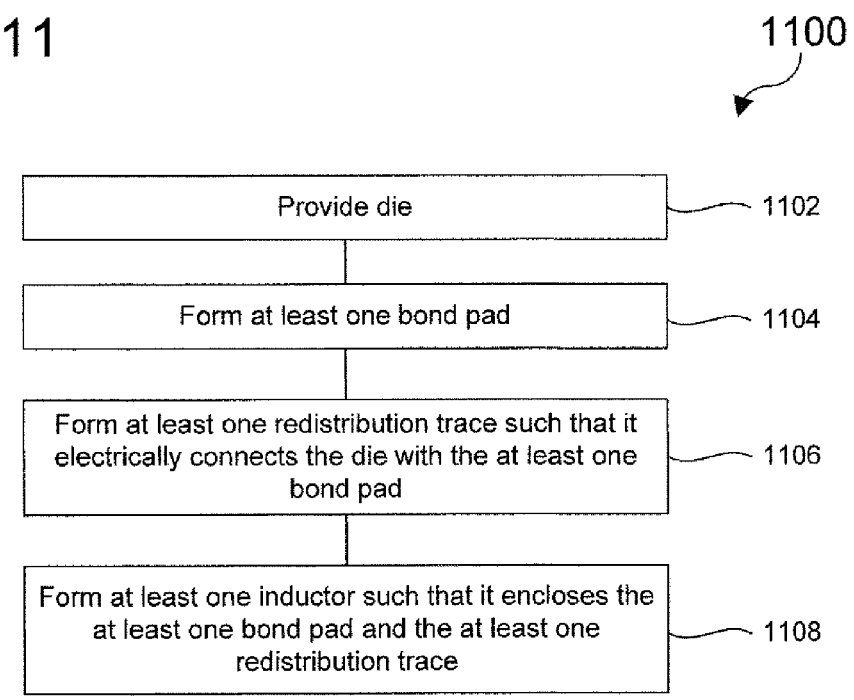
FIG. 11 shows a diagram illustrating a method of manufacturing a die arrangement in accordance with an embodiment.

FIG. 11 shows a diagram 1100 illustrating a method of manufacturing a die arrangement in accordance with an embodiment.

In 1102, a die may be provided.

In 1104, at least one bond pad may be formed.

In 1106, at least one redistribution trace may be formed such that it electrically connects the die with the at least one bond pad.

In 1108, at least one inductor may be formed such that it encloses the at least one bond pad and the at least one redistribution trace.

The die arrangement may be further configured in accordance with one or more embodiments described herein.

Figure 12:
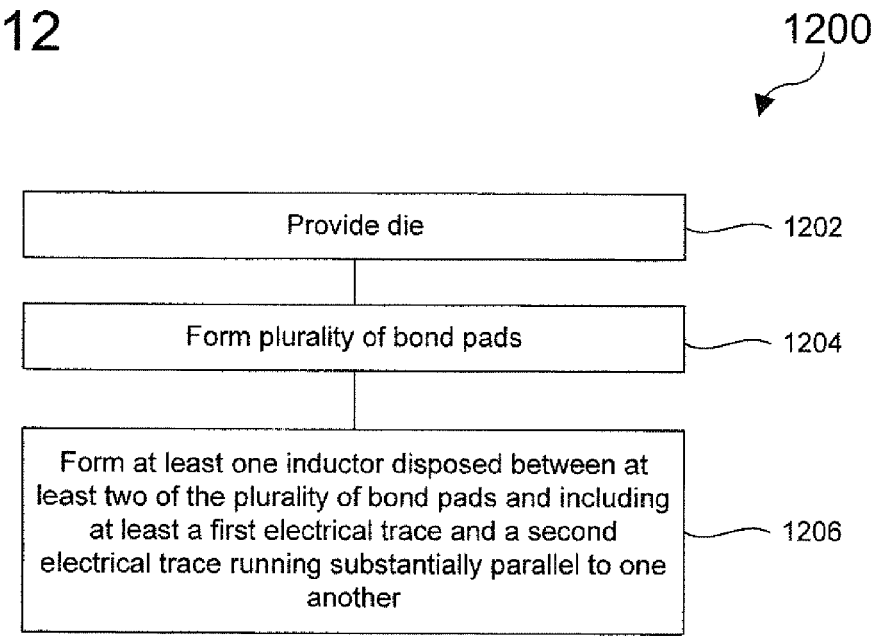
FIG. 12 shows a diagram illustrating a method of manufacturing a die arrangement in accordance with another embodiment.

FIG. 12 shows a diagram 1200 illustrating a method of manufacturing a die arrangement in accordance with another embodiment.

In 1202, a die may be provided.

In 1204, a plurality of bond pads may be formed.

In 1206, at least one inductor may be formed such that it is disposed between at least two of the plurality of bond pads. The at least one inductor may include at least a first electrical trace and a second electrical trace that run substantially parallel to one another.

The die arrangement may be further configured in accordance with one or more embodiments described herein.

Figure 13:
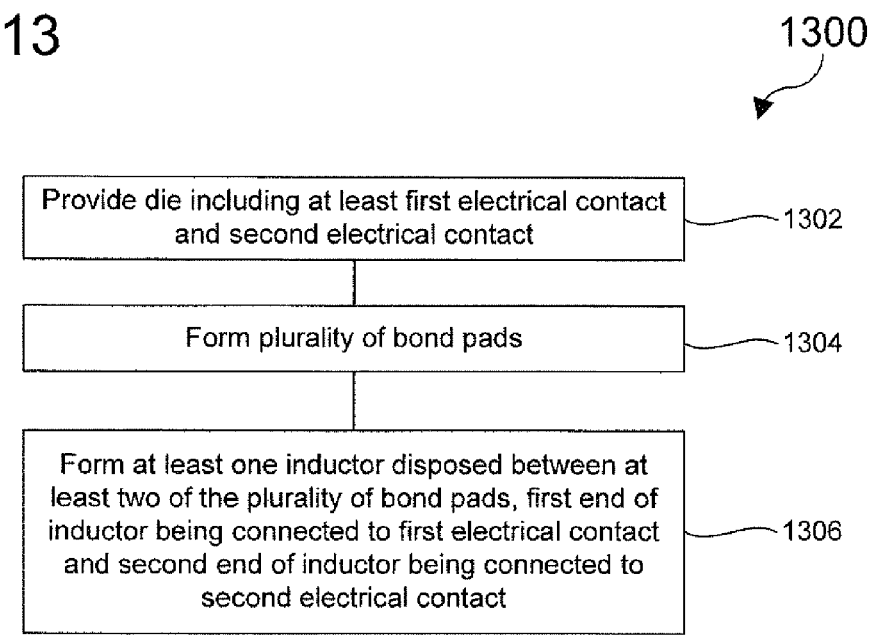
FIG. 13 shows a diagram illustrating a method of manufacturing a die arrangement in accordance with another embodiment.

FIG. 13 shows a diagram 1300 illustrating a method of manufacturing a die arrangement in accordance with another embodiment.

In 1302, a die may be provided. The die may include at least a first electrical contact and a second electrical contact.

In 1304, a plurality of bond pads may be formed.

In 1306, at least one inductor may be formed such that it is disposed between at least two of the plurality of bond pads. A first end of the at least one inductor may be connected to the first electrical contact of the die, and a second end of the at least one inductor may be connected to the second electrical contact of the die.

The die arrangement may be further configured in accordance with one or more embodiments described herein.

In various embodiments, a die arrangement may include: a die; at least one bond pad; at least one redistribution trace electrically connecting the die with the at least one bond pad; and at least one inductor enclosing the at least one bond pad and the at least one redistribution trace.

In various embodiments, the die arrangement may include a redistribution layer.

In various embodiments, the at least one redistribution trace may be part of the redistribution layer.

In various embodiments, the redistribution layer may be disposed at least over a part of the die.

In various embodiments, the at least one redistribution trace may be disposed at least over a part of the die.

In various embodiments, the inductor may be electrically connected to the die.

In various embodiments, the die arrangement may include a plurality of bond pads.

In various embodiments, the die arrangement may include a plurality of redistribution traces.

In various embodiments, the plurality of redistribution traces may be part of the redistribution layer.

In various embodiments, the plurality of redistribution traces may electrically connect the die with the plurality of bond pads.

In various embodiments, each of the plurality of redistribution traces may electrically connect the die with a respective one of the plurality of bond pads.

In various embodiments, the plurality of redistribution traces may be disposed at least over a part of the die.

In various embodiments, the at least one inductor may be disposed in the redistribution layer.

In various embodiments, the die arrangement may include a plurality of inductors.

In various embodiments, the plurality of inductors may be disposed in the redistribution layer.

In various embodiments, the at least one inductor may be configured as a coil having at least one coil winding.

In various embodiments, the at least one coil winding may enclose the at least one bond pad and the at least one redistribution trace.

In various embodiments, the at least one coil winding may enclose the plurality of bond pads and the plurality of redistribution traces.

In various embodiments, the coil may include a plurality of coil windings.

In various embodiments, at least one coil winding of the plurality of coil windings may enclose the at least one bond pad and the at least one redistribution trace.

In various embodiments, the plurality of coil windings may enclose the at least one bond pad and the at least one redistribution trace.

In various embodiments, at least one coil winding of the plurality of coil windings may enclose the plurality of bond pads and the plurality of redistribution traces.

In various embodiments, the plurality of coil windings may enclose the plurality of bond pads and the plurality of redistribution traces.

In various embodiments, the at least one coil winding or the plurality of coil windings may include or may be made of metal.

In various embodiments, the at least one coil winding or the plurality of coil windings may run substantially parallel (or parallel) to a main surface of the die, for example substantially parallel (or parallel) to an upper surface or active surface of the die.

In various embodiments, the at least one redistribution trace or the plurality of redistribution traces may include or may be made of metal.

In various embodiments, the at least one coil winding may include or may be made of the same material (e.g. the same metal material) as the at least one redistribution trace. In various embodiments, the plurality of coil windings may include or may be made of the same material (e.g. the same metal material) as the plurality of redistribution traces.

In various embodiments, a trace width of the at least one redistribution trace or the plurality of redistribution traces may be in the range from approximately 1 µm to approximately 50 µm, for example in the range from approximately 3 µm to approximately 20 µm, for example in the range from approximately 6 µm to approximately 15 µm, for example about 7 µm. In accordance with other embodiments, the trace width may have other values.

In various embodiments, a trace thickness of the at least one redistribution trace may be on the order of several µm or several tens of µm, for example in the range from approximately 5 µm to approximately 35 µm in accordance with some embodiments, for example in the range from approximately 8 µm to approximately 30 µm in accordance with some embodiments, e.g. about 8 µm in accordance with an embodiment, or about 15 µm in accordance with another embodiment, or about 20 µm in accordance with another embodiment, or about 30 µm in accordance with another embodiment. However, in accordance with other embodiments, the trace thickness may have other values.

In various embodiments, a trace width of the coil (clearly, of electrical traces forming the winding(s) of the coil) may be in the range from approximately 1 µm to approximately 50 µm, for example in the range from approximately 3 µm to approximately 20 µm, for example in the range from approximately 6 µm to approximately 15 µm, for example about 7 µm. In accordance with other embodiments, the trace width may have other values.

In various embodiments, a trace width of the inductor coil may be the same or approximately the same as a trace width of the redistribution traces. In accordance with other embodiments, the trace width of the inductor coil may be different from the trace width of the redistribution traces.

In various embodiments, a trace thickness of the inductor coil (clearly, of electrical traces forming the winding(s) of the inductor coil) may be on the order of several µm or several tens of µm, for example in the range from approximately 5 µm to approximately 35 µm in accordance with some embodiments, for example in the range from approximately 8 µm to approximately 30 µm in accordance with some embodiments, e.g. about 8 µm in accordance with an embodiment, or about 15 µm in accordance with another embodiment, or about 20 µm in accordance with another embodiment, or about 30 µm in accordance with another embodiment. However, in accordance with other embodiments, the trace thickness may have other values.

In various embodiments, a trace thickness of the inductor coil may be the same or approximately the same as a trace thickness of the redistribution traces. In accordance with other embodiments, the trace thickness of the inductor coil may be different from the trace thickness of the redistribution traces.

In various embodiments, the die arrangement may further include a reconstitution structure. In various embodiments, the reconstitution structure may at least partially surround the die. In various embodiments, the reconstitution structure may completely surround the die.

In various embodiments, the at least one bond pad may be disposed over the reconstitution structure. In various embodiments, at least some of the plurality of bond pads may be disposed over the reconstitution structure. In various embodiments, the plurality of bond pads may be disposed over the reconstitution structure.

In various embodiments, the at least one bond pad may be disposed proximate to an interface between the die and the reconstitution structure. In various embodiments, at least some of the plurality of bond pads may be disposed proximate to the interface between the die and the reconstitution structure. In various embodiments, the plurality of bond pads may be disposed proximate to the interface between the die and the reconstitution structure.

In various embodiments, the plurality of bond pads may be arranged in at least one row running substantially parallel (or parallel) to the interface between the die and the reconstitution structure. In various embodiments, the plurality of bond pads may be arranged in a plurality of adjacent rows running substantially parallel (or parallel) to the interface between the die and the reconstitution structure.

In various embodiments, the plurality of rows may include at least a first row including a first plurality of the plurality of bond pads, and a second row including a second plurality of the plurality of bond pads.

In various embodiments, the number of bond pads in the first plurality may be the same as the number of bond pads in the second plurality. Alternatively, the number of bond pads in the first plurality may be different from the number of bond pads in the second plurality.

In various embodiments, the first row and the second row may run substantially parallel (or parallel) to the interface between the die and the reconstitution structure. In various embodiments, the second row's distance from the interface between the die and the reconstitution structure may be greater than the first row's distance from the interface between the die and the reconstitution structure. In other words, the bond pads in the first row may be closer to the interface between the die and the reconstitution structure than the bond pads in the second row, in accordance with various embodiments.

In various embodiments, neighboring bond pads in a row and/or neighboring bond pads of two adjacent rows may be spaced apart by a distance of approximately 100 µm to approximately 2540 µm, for example by a distance of approximately 250 µm to approximately 750 µm, for example by a distance of approximately 400 µm to approximately 600 µm, for example by a distance of approximately 500 µm. In other words, a pitch of neighboring bond pads in a row and/or a pitch of neighboring bond pads of two adjacent rows may have a value as described above. In accordance with other embodiments, the pitch or pitches may have other values.

In various embodiments, the pitch of neighboring bond pads in a row may be the same as the pitch of neighboring bond pads of two adjacent rows. Alternatively, the pitches may be different.

In various embodiments, the bond pads may be arranged in a rectangular array or grid array.

In various embodiments, the bond pads may, for example, have a circular shape, an ellipsoidal shape, or a polygonal shape such as e.g. a triangular shape, a quadratic shape, or a rectangular shape. In accordance with other embodiments, the pads may have a different shape.

In various embodiments, a bond pad diameter may be in the range from approximately 50 µm to approximately 1750 µm, for example in the range from approximately 50 µm to approximately 750 µm, for example in the range from approximately 100 µm to approximately 500 µm, for example in the range from approximately 200 µm to approximately 300 µm, for example about 260 µm. In accordance with other embodiments, the bond pad diameter may have other values.

In various embodiments, the at least one redistribution trace may be disposed partially over the reconstitution structure and partially over the die. In various embodiments, at least some of the plurality of redistribution traces may be disposed partially over the reconstitution structure and partially over the die. In various embodiments, the plurality of redistribution traces may be disposed partially over the reconstitution structure and partially over the die.

In various embodiments, the die may include at least one electrical contact connected to the at least one redistribution trace.

In various embodiments, the at least one electrical contact may be disposed proximate to the interface between the die and the reconstitution structure.

In various embodiments, the at least one inductor may enclose the at least one electrical contact connected to the at least one redistribution trace.

In various embodiments, the at least one coil winding may enclose the at least one electrical contact connected to the at least one redistribution trace. In various embodiments, at least some of the plurality of coil windings may enclose the at least one electrical contact connected to the at least one redistribution trace. In various embodiments, the plurality of coil windings may enclose the at least one electrical contact connected to the at least one redistribution trace.

In various embodiments, the die may include a plurality of electrical contacts connected to the plurality of redistribution traces. In various embodiments, each of the plurality of electrical contacts may be connected to a respective one of the plurality of redistribution traces.

In various embodiments, the at least one inductor may enclose the plurality of electrical contacts connected to the plurality of redistribution traces.

In various embodiments, the at least one coil winding may enclose the plurality of electrical contacts connected to the plurality of redistribution traces. In various embodiments, at least some of the plurality of coil windings may enclose the plurality of electrical contacts connected to the plurality of redistribution traces. In various embodiments, the plurality of coil windings may enclose the plurality of electrical contacts connected to the plurality of redistribution traces.

In various embodiments, the at least one electrical contact connected to the at least one redistribution trace may be disposed proximate to the interface between the die and the reconstitution structure. In various embodiments, at least one of the plurality of electrical contacts connected to the plurality of redistribution traces may be disposed proximate to the interface between the die and the reconstitution structure. In various embodiments, the plurality of electrical contacts connected to the plurality of redistribution traces may be disposed proximate to the interface between the die and the reconstitution structure.

In various embodiments, the die may include at least one electrical contact connected to the at least one inductor. In various embodiments, the at least one inductor may be disposed such that it encloses the at least one electrical contact connected to the at least one inductor.

In various embodiments, the at least one coil winding may enclose the at least one electrical contact connected to the at least one inductor.

In various embodiments, the plurality of coil windings may enclose the at least one electrical contact connected to the at least one inductor.

In various embodiments, the at least one electrical contact connected to the at least one inductor may be disposed proximate to the interface between the die and the reconstitution structure.

In various embodiments, the die may include at least one additional electrical contact connected to the at least one inductor. In various embodiments, the at least one additional electrical contact may be disposed outside of the at least one inductor.

In various embodiments, the at least one additional electrical contact may be disposed outside of the at least one coil winding.

In various embodiments, the at least one additional electrical contact may be disposed outside of the plurality of coil windings.

In various embodiments, the at least one additional electrical contact may be disposed proximate to the interface between the die and the reconstitution structure.

In various embodiments, the die arrangement may include at least one additional bond pad. In various embodiments, the at least one additional bond pad may be electrically connected to the at least one inductor. In various embodiments, the at least one inductor may enclose the at least one additional bond pad.

In various embodiments, the at least one coil winding may enclose the at least one additional bond pad. In various embodiments, at least some of the plurality of coil windings may enclose the at least one additional bond pad. In various embodiments, the plurality of coil windings may enclose the at least one additional bond pad.

In various embodiments, the at least one additional bond pad may be disposed over the reconstitution structure.

In various embodiments, the at least one inductor may be disposed partially over the reconstitution structure and partially over the die.

In various embodiments, the at least one coil winding may be disposed partially over the reconstitution structure and partially over the die. In various embodiments, at least some of the plurality of coil windings may be disposed partially over the reconstitution structure and partially over the die. In various embodiments, the plurality of coil windings may be disposed partially over the reconstitution structure and partially over the die.

In various embodiments, the die arrangement may include a plurality of bond pads and a plurality of redistribution traces, and the die may include a plurality of electrical contacts. In various embodiments, each of the plurality of redistribution traces may electrically connect one of the plurality of bond pads with a respective one of the plurality of electrical contacts of the die. In various embodiments, the at least one inductor may be disposed such that it encloses the plurality of bond pads, the plurality of redistribution traces and the plurality of electrical contacts.

In various embodiments, the reconstitution structure may include or may be made of a mold compound.

In various embodiments, the reconstitution structure may be configured as a mold frame.

In various embodiments, the die arrangement may be configured as a fan-out package, for example as a fan-out wafer level package such as, for example, an embedded wafer level ball grid array (eWLB), alternatively as other type of fan-out wafer level package, e.g. as a fan-out wafer level package that is not cast-based or includes so-called embedding technologies.

In various embodiments, a method of manufacturing a die arrangement may include: providing a die; forming at least one bond pad; forming at least one redistribution trace such that the at least one redistribution trace electrically connects the die with the at least one bond pad; forming at least one inductor such that the at least one inductor encloses the at least one bond pad and the at least one redistribution trace. The die arrangement may further be configured in accordance with one or more embodiments described herein.

In various embodiments, a die arrangement may include: a die including an electrical contact; a reconstitution structure at least partially surrounding the die; a bond pad disposed over the reconstitution structure; a redistribution trace electrically connecting the bond pad with the electrical contact; an inductor disposed partially over the die and partially over the reconstitution structure and enclosing the electrical contact, the bond pad and the redistribution trace.

In various embodiments, the electrical contact may be disposed proximate to an interface between the die and the reconstitution structure.

In various embodiments, the bond pad may be disposed proximate to the interface between the die and the reconstitution structure.

In various embodiments, the inductor may be configured as a coil having at least one coil winding. The at least one coil winding may enclose the electrical contact, the bond pad and the redistribution trace.

In various embodiments, the at least one coil winding may run substantially parallel to a main surface of the die.

In various embodiments, the die may further include an additional electrical contact connected to the inductor. The inductor may be disposed such that it encloses the additional electrical contact.

In various embodiments, the die arrangement may include an additional bond pad disposed over the reconstitution structure. The inductor may be disposed such that it encloses the additional bond pad and is electrically connected to the additional bond pad.

In various embodiments, the reconstitution structure may include or may be made of a mold compound.

In various embodiments, the reconstitution structure may be configured as a mold frame.

In various embodiments, the die arrangement may be configured as a fan-out package, for example as a fan-out wafer level package such as, for example, an embedded wafer level ball grid array (eWLB), alternatively as other type of fan-out wafer level package, e.g. as a fan-out wafer level package that is not cast-based or includes so-called embedding technologies.

The die arrangement may further be configured in accordance with one or more embodiments described herein.

In various embodiments, a die arrangement may include: a die; a plurality of bond pads; at least one inductor disposed between at least two of the plurality of bond pads. The at least one inductor may include at least a first electrical trace and a second electrical trace that run substantially parallel (or parallel) to one another.

In various embodiments, a current flow direction in the first electrical trace may be substantially anti-parallel (or anti-parallel) to a current flow direction in the second electrical trace.

The die arrangement may further be configured in accordance with one or more embodiments described herein.

In various embodiments, a die arrangement may include: a die comprising at least a first electrical contact and a second electrical contact; a plurality of bond pads; at least one inductor disposed between at least two of the plurality of bond pads. A first end of the inductor may be connected to the first electrical contact of the die, and a second end of the inductor may be connected to the second electrical contact of the die. The die arrangement may further be configured in accordance with one or more embodiments described herein.

In the following, certain features, aspects and effects of exemplary embodiments are described.

In accordance with various embodiments, a beneficial way may be provided to accommodate one or more inductors (e.g. one or more coils) in a redistribution layer (RDL) of a package such as, for example, a fan-out package having only one wiring level, for example a fan-out wafer level package such as e.g. an embedded wafer level ball grid array (eWLB), alternatively any other fan-out wafer level package, which may e.g. be arranged on a fixed carrier.

In accordance with various embodiments, an inductor (e.g. a coil) may be disposed in the redistribution layer (RDL) in such a manner that additional wiring levels (i.e. a second wiring level and possibly further wiring levels), which may conventionally be needed to connect the inductor with an integrated circuit (IC) or die, may be spared. In accordance with various embodiments it may further be possible to place the inductor such that the inductor may occupy no additional space or only little additional space in the redistribution layer. Thus, in accordance with various embodiments, a cost-efficient redistribution design including one or more inductors (e.g. coils) may be provided. For example, if in case of a fan-out package having only one wiring level the inductor(s) (e.g. coil(s)) and the RDL are, for example, formed in the same process (e.g. same metallization process), the inductor(s) (e.g. coil(s)) may be obtained with almost no additional costs.

In accordance with various embodiments, a redistribution or wiring design may be provided that may take advantage of the good design rules of an eWLB in such a manner that an inductor (e.g. a coil), coming from the die or chip, may be implemented in such a manner that it lies directly next to an integrated circuit (IC) and similar rows arranged behind. Thus, the balls located inside the inductor may be connected coming from the IC.

In accordance with various embodiments, an inductor (e.g. a coil, including also coils with several windings) may be connected to an integrated circuit (IC) in such a manner that the inductor is closed within the pad rows and, coming from the IC, encloses balls in its inside, which may nevertheless be connected by the integrated circuit (IC).

In accordance with various embodiments, an area-efficient and thus cost-efficient way may be provided for accommodating one or more inductors (e.g. one or more coils), including inductors with high inductivity and/or high quality factor (Q-factor), in the redistribution layer (RDL) of a package.

In accordance with various embodiments, traces of an inductor, e.g. coil windings of an inductor coil, may be located between bond pads (or ball pads). In accordance with various embodiments, all pads (or balls) may be used and no area may be "wasted" by the coil. In accordance with various embodiments, loop closing may be achieved over the integrated circuit (IC) with IC or RDL metal or both.

Die arrangements in accordance with some embodiments described herein (for example, the die arrangement in accordance with the embodiment shown in FIG. 5) may, for example, also be used with or configured as a wire bond package, in other words as a package where bond pads are contacted by means of a wire bonding process.

Die arrangement in accordance with some embodiments described herein may, for example, also be used in connection with a flip chip process.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A die arrangement, comprising:
   a die;
   at least one bond pad;
   at least one redistribution trace electrically connecting the die with the at least one bond pad;
   at least one inductor enclosing the at least one bond pad and the at least one redistribution trace; and
   a reconstitution structure at least partially surrounding the die, wherein the at least one bond pad is disposed over the reconstitution structure;
   wherein the reconstitution structure comprises a mold compound; and
   wherein the reconstitution structure abuts one or more lateral surfaces of the die and wherein the reconstitution structure does not cover a surface of the die that faces the at least one inductor, and
   wherein the at least one inductor is disposed partially over the reconstitution structure and partially over the die.

2. The die arrangement of claim 1, wherein the at least one bond pad is disposed proximate to an interface between the die and the reconstitution structure.

3. The die arrangement of claim 1, further comprising at least one additional bond pad electrically connected to the at least one inductor, wherein the at least one inductor is disposed such that it encloses the at least one additional bond pad.

4. The die arrangement of claim 1, comprising a plurality of bond pads and a plurality of redistribution traces, wherein the die comprises a plurality of electrical contacts, wherein each of the redistribution traces electrically connects one of the plurality of bond pads with a respective one of the plurality of electrical contacts of the die, and wherein the at least one inductor is disposed such that it encloses the plurality of bond pads, the plurality of redistribution traces and the plurality of electrical contacts.

5. The die arrangement of claim 1, configured as a fan-out package.

6. The die arrangement of claim 1, wherein the at least one inductor is configured as a coil having at least one coil winding, wherein the at least one coil winding encloses the at least one bond pad and the at least one redistribution trace.

7. The die arrangement of claim 6, wherein the at least one coil winding runs substantially parallel to a main surface of the die.

8. The die arrangement of claim 1, wherein the die comprises at least one electrical contact connected to the at least one redistribution trace, wherein the at least one electrical contact is disposed proximate to an interface between the die and the reconstitution structure.

9. The die arrangement of claim 8, wherein the at least one inductor is disposed such that it encloses the at least one electrical contact.

10. The die arrangement of claim 1, wherein the die comprises at least one electrical contact connected to the at least one inductor, wherein the at least one electrical contact is disposed proximate to an interface between the die and the reconstitution structure.

11. The die arrangement of claim 10, wherein the at least one inductor is disposed such that it encloses the at least one electrical contact.

12. A die arrangement, comprising:
a die comprising an electrical contact;
a reconstitution structure at least partially surrounding the die;
a bond pad disposed over the reconstitution structure;
a redistribution trace electrically connecting the bond pad with the electrical contact; and
an inductor disposed partially over the die and partially over the reconstitution structure and enclosing the electrical contact, the bond pad and the redistribution trace;
wherein the reconstitution structure comprises a mold compound; and
wherein the reconstitution structure abuts one or more lateral surfaces of the die and wherein the reconstitution structure does not cover a surface of the die that faces the at least one inductor, and
wherein the at least one inductor is disposed partially over the reconstitution structure and partially over the die.

13. The die arrangement of claim 12, wherein the die further comprises an additional electrical contact connected to the inductor, wherein the inductor is disposed such that it encloses the additional electrical contact.

14. The die arrangement of claim 12, wherein the die further comprises an additional bond pad disposed over the reconstitution structure, wherein the inductor is disposed such that it encloses the additional bond pad and is electrically connected to the additional bond pad.

15. The die arrangement of claim 12, configured as an embedded wafer level ball grid array.

16. The die arrangement of claim 12, wherein the electrical contact is disposed proximate to an interface between the die and the reconstitution structure.

17. The die arrangement of claim 16, wherein the bond pad is disposed proximate to the interface between the die and the reconstitution structure.

18. The die arrangement of claim 12, wherein the inductor is configured as a coil having at least one coil winding, wherein the at least one coil winding encloses the electrical contact, the bond pad and the redistribution trace.

19. The die arrangement of claim 18, wherein the at least one coil winding runs substantially parallel to a main surface of the die.

20. A method of manufacturing a die arrangement, the method comprising:
providing a die;
forming at least one bond pad;
forming at least one redistribution trace such that the at least one redistribution trace electrically connects the die with the at least one bond pad;
forming at least one inductor such that the at least one inductor encloses the at least one bond pad and the at least one redistribution trace; and
forming a reconstitution structure at least partially surrounding the die, wherein the at least one bond pad is disposed over the reconstitution structure;
wherein the reconstitution structure comprises a mold compound; and
wherein the reconstitution structure abuts one or more lateral surfaces of the die and wherein the reconstitution structure does not cover a surface of the die that faces the at least one inductor, and
wherein the at least one inductor is disposed partially over the reconstitution structure and partially over the die.

21. A die arrangement, comprising:
a die;
a plurality of bond pads;
at least one inductor disposed between at least two of the plurality of bond pads, wherein the at least one inductor comprises at least a first electrical trace and a second electrical trace that run substantially parallel to one another; and
a reconstitution structure at least partially surrounding the die, wherein at least one of the plurality of bond pads is disposed over the reconstitution structure;
wherein the reconstitution structure comprises a mold compound; and
wherein the reconstitution structure abuts one or more lateral surfaces of the die and wherein the reconstitution structure does not cover a surface of the die that faces the at least one inductor, and
wherein the at least one inductor is disposed partially over the reconstitution structure and partially over the die.

22. A die arrangement, comprising:
a die comprising at least a first electrical contact and a second electrical contact;
a plurality of bond pads; and
at least one inductor disposed between at least two of the plurality of bond pads, wherein a first end of the at least one inductor is connected to the first electrical contact of the die and a second end of the at least one inductor is connected to the second electrical contact of the die; and
a reconstitution structure at least partially surrounding the die, wherein at least one of the plurality of bond pads is disposed over the reconstitution structure;
wherein the reconstitution structure comprises a mold compound; and
wherein the reconstitution structure abuts one or more lateral surfaces of the die and wherein the reconstitution structure does not cover a surface of the die that faces the at least one inductor, and
wherein the at least one inductor is disposed partially over the reconstitution structure and partially over the die.

* * * * *